United States Patent [19]

Yamamoto et al.

[11] Patent Number: 5,100,865
[45] Date of Patent: Mar. 31, 1992

[54] FABRICATION OF SINTERED OXIDE SUPERCONDUCTING WIRES

[75] Inventors: Susumu Yamamoto; Nozomu Kawabe; Teruyuki Murai, all of Itami, Japan

[73] Assignee: Sumitomo Electric Industries, Ltd., Osaka, Japan

[21] Appl. No.: 438,986

[22] Filed: Nov. 20, 1989

Related U.S. Application Data

[63] Continuation of Ser. No. 180,494, Apr. 12, 1988, abandoned.

[30] Foreign Application Priority Data

Apr. 17, 1987 [JP] Japan .................. 62-96400

[51] Int. Cl.$^5$ .................. H01B 5/02; H01L 39/24
[52] U.S. Cl. .................. 505/1; 505/704; 427/62; 29/599; 29/33 D; 174/125.1; 419/20
[58] Field of Search .................. 505/1, 704, 740; 427/62, 63, 117; 29/599, 33 D; 419/5, 19, 20; 174/125.1

[56] References Cited

U.S. PATENT DOCUMENTS

| | | | |
|---|---|---|---|
| 3,471,925 | 10/1969 | Bindari | 29/599 |
| 4,101,731 | 7/1978 | Marancik | 29/599 |
| 4,223,434 | 9/1980 | Wang et al. | 29/599 |
| 4,906,609 | 3/1990 | Yamauchi et al. | 505/1 |

OTHER PUBLICATIONS

Yamada et al., "Critical Current Density of Wire Type Y-Ba-Cu Oxide Superconductor" Jpn. J. Appl. Phys. 26(5) May 1987 L865-866.
Kohno et al., "Critical Temperature and Critical Current Density of La-Sr-Cu Oxide Wires" Jpn. J. Appl. Phys. 26(5) May 1987 L759-760.
Tsukuba et al., "Asahi Newspaper" 3/10/1987.
Cava et al., "Bulk Superconductivity at 36K in $La_{1.8}Sr_{0.2}CuO_4$" Phys. Rev. Letters, vol. 58, No. 4 (1987) pp. 408-410.
"Superconductivity at 93K in a New Mixed-Phase Y-Ba-Cu-O Compound System at Ambient Pressure", vol. 58, No. 9, M. K. Wu et al., pp. 908-910, 2 Mar. 1987, Physical Review Letters.
"Superconductivity and Magnetism in the High-$T_c$ Superconductor Y-Ba-Cu-O", J. Z. Sun et al., vol. 58, No. 15, Physical Review Letters, pp. 1574-1576, Apr. 1987.
"High $T_c$ Superconductivity of La-Ba-Cu Oxides", Shin-ichi Uchida et al., Jan. 1987, pp. L1-L2.
"Possible High $T_c$ Superconductivity in the Ba-La-Cu-O Systems" J. G. Bednorz and K. A. Muller, Z. Phys. B-Condensed Matter 64, pp. 189-193 (1986).

Primary Examiner—Shrive Beck
Assistant Examiner—Roy V. King
Attorney, Agent, or Firm—Pennie & Edmonds

[57] ABSTRACT

The present invention relates to a sintered ceramic wire.

Ceramic materials, such as AlN, $Si_3N_4$ and $Al_2O_3$, have various superior characteristics including heat-resistance, and sintered ceramic materials have been of interest as superconducting materials of high critical temperatures.

However, various disadvantages are involved in the formation of the sintered ceramic materials as thin wires, and in the practical use thereof.

The present invention elminates such disadvantages to provide a thin and long sintered ceramic wire having sufficient strength and toughness to avoid breakage.

A sintered wire is made by placing powders of metal oxides, precursors of the desired sintered material, having oxidation potentials less than that of copper, in a tube of a high temperature oxidation-resistant metal. This product is worked to its final size and a sintering step is performed. The method is satisfactory for manufacture of ceramic superconductors.

19 Claims, No Drawings

FABRICATION OF SINTERED OXIDE SUPERCONDUCTING WIRES

This is a continuation of application Ser. No. 180,494, filed Apr. 12, 1988, now abandoned.

FIELD OF THE INVENTION

The present invention relates to a sintered wire.

PRIOR ART

Recently, ceramic materials, such as AlN, $Si_3N_4$ and $Al_2O_3$, have been employed for various purposes due to their superior characteristics, including heat-resistance.

In addition, sintered ceramic materials, such as La-Sr-Cu-O materials and La-Ba-Cu-O materials, have become of interest as superconducting materials having high critical temperatures, and have been rapidly developed.

However, many useful products involving sintered ceramic materials require that they be configured as thin wires.

In general, ceramics have been difficult to produce in wire form. Wires have been produced by a method in which ceramic raw material powders are blended with suitable organic adhesives. The resulting blend is extruded as a thin rod.

The blend can also be extruded in the form of a square and ground to form a thin rod, followed by an intermediate sintering step to remove the organic adhesive, and additional sintering.

However, the method in which the blend is extruded in the form of a square precursor and then ground to a thin rod followed by sintering, has a disadvantage in that the available efficiency of the expensive ceramic raw material powders is low. Furthermore, it is not possible to make the thin rod sufficiently long relative to its cross-sectional dimension due to the grinding process employed, and the productivity is low.

On the other hand, the method in which the blend is extruded in the form of a thin rod and then sintered, has advantages in that the available efficiency of the ceramics raw material powders is high, and the productivity is high. This method has a disadvantage in that in order to conduct the extrusion molding, a large amount of organic adhesive must be added to the raw material powders, whereby the adhesive is difficult to completely remove during the intermediate sintering step. Removal of the adhesive during the final sintering step leads to the generation of voids, lowering the strength and toughness of the resulting sintered ceramic body.

In addition, it has been difficult to form the thin rod sufficiently long.

SUMMARY OF THE INVENTION

A sintered wire according to the present invention is characterized in that raw material powders are placed in a metallic cylinder formed of high temperature oxidation-resisting materials. This cylinder is drawn to a desired shape and size, and is sintered. The powder mixture comprises powders of oxides of metals having oxidation potential ($\Delta G°$) equal to or higher than that of copper at normal or elevated temperatures. As the metallic cylinder filled with the raw material powders is repeatedly drawn, intermediate additional sintering and annealing steps are performed as needed.

DESCRIPTION OF THE PREFERRED EMBODIMENTS

According to the present invention, a metallic cylinder formed of a high temperature oxidation-resisting material is filled with powders of oxides of metals having an oxidation potential ($\Delta G°$) equal to or higher than that of copper at normal or elevated temperatures, worked to a desired shape and size, and heat-treated to produce a sintered wire. Reduction of the raw material powders by the material of the cylinder is thus suppressed as far as possible, whereby a superior sintered wire can be obtained.

A sintered ceramic wire obtained according to the present invention comprises a thin metallic coating around an outside circumference thereof. This metallic coating may be removed later or not, as required.

In addition, according to the present invention intermediate heat-treatments during the drawing process may be carried out. The metallic cylinder may be removed before the final sintering step. If the final sintering temperature of the ceramic powders is high, reaction between the metallic cylinder and the metals can thus be prevented.

The above described drawing steps and intermediate heat treatments are followed by removal of the metallic cylinder and subsequent sintering.

The metallic cylinder is removed after the sintering process when the absence of the metallic cylinder provides an improved product; for example, where the original characteristics of the ceramic material (for example corrosion-resistance and abrasion-resistance) are required on its surface.

The process of the present invention may be carried out by die drawing, roller die drawing, rolling, swaging and extrusion.

Where the bulk density of the ceramic raw material powders to be charged in the metallic cylinder is low, the raw material powders can be granulated, resulting in higher packing density.

According to the present invention, the ceramic raw material powders can be subjected to the drawing process even without addition of organic adhesives. The intermediate heat-treatment is conducted at a temperature at which the cylinder is annealed but the ceramic powders are not sintered. The drawing process is followed by sintering the ceramic powders. Thus, the overall amount of working can be increased to obtain a ceramic wire of small diameter and increased strength, without breakage.

The intermediate heat treatment temperature, at which the metallic cylinder is annealed but the ceramic powders are not sintered, may be selected depending upon the metals or alloys forming the cylinder.

According to the present invention, the size of the sintered ceramic wire can be optionally selected, and a length 30 times or more times the cross-sectional dimension of the wire can be attained.

The present invention exhibits an advantage also in that the raw material powders, comprising expensive ingredients, are used efficiently.

The metallic elements having oxidation potential higher than that of copper according to the present invention include Os, Ir, Al, Ag, Au, Pt, K, Rh, Mo, Se, Na and the like, and the oxides of said metallic elements include $OsO_4$, $IrO_2$, $AlO_2$, $AgO$, $AuO$, $PtO$, $Ko_2$, $RhO$, $Rh_2O_3$, $MoO_2$, $SeO_2$, $SeO$, $NaO_2$ and the like.

In addition, suitable Ni-base alloys include Ni-Cr-Fe, Ni-Mo-CrFe, Ni-Cr-Mo-W-Fe, Ni-Cr-Mn-Fe and the like.

The present invention can be applied in particular to a sintered ceramic wire formed of perovskite or pseudo-perovskite type oxides, such as Ba-Y-Cu-O series, La-Sr-Cu-O series and Ba-La-Cu-O series.

EXAMPLE 1

A cylinder formed of iron having an outside diameter of 5 mm, inside diameter of 4 mm and length of 1 m was filled with $Ag_2O$ powder on the market, closed at both ends, and drawn to a diameter of 2.5 mm, followed by sintering at 900° C. for 2 hours in air. The outer portion of sintered $Ag_2O$ having a diameter of 2.0 mm (of 0.7 mm thick) was almost completely reduced to pure Ag, and only $Ag_2O$ having a diameter of 0.6 mm was left in the central portion.

Next, the same treatment as described above was conducted using a pipe formed of Inconel 601 having the same form. The reduced layer of the $Ag_2O$ sintered body was 0.08 mm thick. That is, the product was almost completely sintered $Ag_2O$.

EXAMPLE 2

$Y_2O_3$ powders of 20.0% by weight, $BaCO_3$ powders of 54.7% by weight and CuO powders of 24.5% by weight on the market were subjected to a wet blending and then dried. The dried powders were molded by pressing at a pressure of 100 Kg/cm$^2$ and then baked at 880° C. for 24 hours in air followed by pulverizing to 100 mesh or less. This process including press molding, baking, pulverizing and screening was repeated 3 times.

A cylinder formed of copper having an outside diameter of 5 mm, inside diameter of 4 mm and length of 1 m was filled with the raw material powders treated in the above described manner and closed at both ends.

The cylinder filled with the raw material powders was drawn to an outside diameter of 1.2 mm, and sintered at 930° C. for 3 hours. As a result, a sintered ceramic wire having a length of 7.7 m clad with a copper layer having a thickness of 0.2 mm was obtained.

Such a ceramic wire ought to be a perovskite, showing superconductivity, but it did not exhibit the superconducting characteristics at all.

This sintered ceramic wire was colored red, that is, it was presumed that CuO was reduced to Cu, but X-ray analysis did not show the peaks of perovskite, while the peaks of Cu and CuO and the like were observed.

Next, a cylinder formed of stainless steel type 304 was filled with said powders and subjected to similar treatment to obtain a sintered ceramic wire having the critical temperature (Tc) of 68° K. The sintered body was colored bright green, excluding the extreme outer surface thereof, and X-ray diffraction showed the characteristic peaks as those of perovskite produced by the conventional press-sintering method, having typical critical temperatures of 70° K.

This shows that the relative oxidation potential of the sheath metal and the superconductor precursor powders are important in obtaining superconductive characteristics.

EXAMPLE 3

$La_2O_3$ powders of 85.5% by weight, $SrCO_3$ powders of 3.1% by weight and CuO powders of 11.4% by weight on the market were wet blended and then dried. The powder mixture was molded by pressing at a pressure of 100 Kg/cm$^2$ and then baked at 900° C. for 20 hours in air followed by pulverizing to 100 mesh or less.

A cylinder formed of stainless steel type 310 having an outside diameter of 5 mm, inside diameter of 4 mm and length of 1 m was filled with this particulate raw material powder and closed at both ends.

The cylinder filled with the above described raw material powders was drawn to an outside diameter of 1.8 mm, and sintered at 1,050° C. for 2 hours in air. A sintered ceramic superconducting wire having a length of 7.7 m clad with a copper layer having a thickness of 0.2 mm was obtained.

This sintered ceramic superconducting wire showed the critical temperature of superconductivity of 37° K. and yield strength of 26.2 Kg/mm$^2$.

The same treatment was carried out except that a cylinder formed of iron was used. A reduced surface layer having a thickness of about 0.2 mm was observed, but the resulting sintered ceramic superconducting wire had a critical temperature of only 34.2° K.

It can be concluded that the non-reduced central portion is superconductive, but the critical temperature is lower than in the case where the cylinder formed of stainless steel type 310 was used.

The yield strength was essentially the same, that is, 27.0 Kg/mm$^2$.

It was thus found that the reduction-preventing nature of the sheath material contributed to the characteristics of the resulting sintered wire, in particular in connection with ceramic superconductors, in particular perovskite or pseudo-perocskite type oxides.

We claim:

1. A method of making a sintered wire of a desired ceramic copper oxide superconductive material, comprising the steps of:
    packing powders of metal oxides or a mixture of powders of metal oxides and metal carbonates which, when sintered, form the desired ceramic copper oxide superconductive material, said oxides and said carbonates each having an oxidation potential ($\Delta G°$) higher than or equal to that of copper, in a cylinder formed from a material selected from the group consisting of high temperature oxidation-resistant stainless steel and high temperature oxidation-resistant nickel alloy;
    drawing said packed cylinder to a desired size; and
    sintering said drawn packed cylinder in air to form said wire,
    wherein said cylinder is removed prior to the final step of sintering.

2. The method of claim 1 wherein said cylinder is formed of high-temperature oxidation-resistant stainless steel.

3. The method of claim 1, comprising the further step of performing an intermediate heat treatment at a temperature at which the metallic cylinder is annealed.

4. The method of claim 3, wherein several such intermediate heat treatments are performed.

5. The method of claim 4, wherein said powders are sintered during said intermediate heat treatment.

6. The method of claim 1, wherein the drawing step is carried out using die drawing, rolling, swaging and/or extrusion.

7. The method of claim 1, comprising the further step of particulating said powders prior to said packing step.

8. The method of claim 1, wherein said superconductor is of perovskite or pseudo-perovskite structure.

9. The method of claim 1, wherein said superconductor is selected from the group consisting of Ba-Y-Cu-O, La-Sr-Cu-O, and Ba-La-Cu-O.

10. A product by the process of any one of claims 2, 3-7, 8 or 9.

11. A method of making a sintered wire of a desired ceramic copper oxide superconductive material, comprising the steps of:

packing powders of metal oxides or a mixture of powders of metal oxides and metal carbonates which, when sintered, form the desired ceramic copper oxide superconductive material, said oxides and said carbonates each having an oxidation potential ($\Delta G°$) higher than or equal to that of copper, in a cylinder formed from a material from the group consisting of high temperature oxidation-resistant stainless steel and high temperature oxidation-resistant nickel alloy:

drawing said packed cylinder to a desired size; and sintering said drawn packed cylinder in air to form said wire, wherein said cylinder is removed subsequent the final step of sintering.

12. The method of claim 11, wherein said cylinder is formed of high temperature oxidation-resistant stainless steel.

13. The method of claim 11, comprising the further step of performing an intermediate heat treatment at a temperature at which the metallic cylinder is annealed.

14. The method of claim 13, wherein several such intermediate heat treatments are performed.

15. The method of claim 14, wherein said powders are sintered during said intermediate heat treatment.

16. The method of claim 11, wherein the drawing step is carried out using die drawing, rolling, swaging and/or extrusion.

17. The method of claim 11, comprising the further step of particulating said powders prior to said packing step.

18. The method of claim 11, wherein said superconductor is comprised of perovskite or pseudo-perovskite structure.

19. The method of claim 11, wherein said superconductor is selected from the group consisting of Ba-Y-Cu-O, La-Sr-Cu-O, and Ba-La-Cu-O.

* * * * *